(12) United States Patent
Nakama et al.

(10) Patent No.: US 12,525,970 B2
(45) Date of Patent: Jan. 13, 2026

(54) DRIVE CIRCUIT

(71) Applicant: SONY SEMICONDUCTOR SOLUTIONS CORPORATION, Kanagawa (JP)

(72) Inventors: Mai Nakama, Kumamoto (JP); Takahiro Sonoda, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/570,259

(22) PCT Filed: Dec. 28, 2021

(86) PCT No.: PCT/JP2021/048869
§ 371 (c)(1),
(2) Date: Dec. 14, 2023

(87) PCT Pub. No.: WO2022/269953
PCT Pub. Date: Dec. 29, 2022

(65) Prior Publication Data
US 2024/0291480 A1 Aug. 29, 2024

(30) Foreign Application Priority Data
Jun. 23, 2021 (JP) .................. 2021-103715

(51) Int. Cl.
*H03K 17/16* (2006.01)
*H03F 3/45* (2006.01)
*H03K 17/30* (2006.01)

(52) U.S. Cl.
CPC ....... *H03K 17/162* (2013.01); *H03F 3/45973* (2013.01); *H03K 17/302* (2013.01); *H03F 2200/261* (2013.01)

(58) Field of Classification Search
CPC .............. H03K 17/162; H03K 17/302; H03K 19/0175; H03K 5/2472; H03K 5/2481;
(Continued)

(56) References Cited

U.S. PATENT DOCUMENTS

2009/0231319 A1* 9/2009 Tsuchi ............... H03F 3/45183
330/253

FOREIGN PATENT DOCUMENTS

JP 2006-050638 A 2/2006
JP 2012-518968 A 8/2012
(Continued)

OTHER PUBLICATIONS

International Search Report and Written Opinion of PCT Application No. PCT/JP2021/048869, issued on Apr. 5, 2022, 08 pages of ISRWO.

*Primary Examiner* — Jung Kim
(74) *Attorney, Agent, or Firm* — CHIP LAW GROUP

(57) ABSTRACT

In a drive circuit provided with a driver, signal quality is improved.
There is provided a drive circuit that includes a driver, an amplitude adjuster, and a common voltage adjuster. In this drive circuit, the driver outputs a differential signal. The amplitude adjuster generates, from one of a pair of voltages, the other of the pair of voltages, and supplies the other of the pair of voltages to one of a power supply terminal and a ground terminal of the driver. The common voltage adjuster generates the one of the pair of voltages from an intermediate voltage between the pair of voltages, and supplies the one of the pair of voltages to the other of the power supply terminal and the ground terminal.

14 Claims, 14 Drawing Sheets

(58) Field of Classification Search
CPC .......... H03F 3/45973; H03F 2200/261; H03F 3/45475; H04L 25/02; G11C 7/062; G11C 7/065; G11C 7/06; G01R 19/0038
See application file for complete search history.

(56) References Cited

FOREIGN PATENT DOCUMENTS

| | | | |
|---|---|---|---|
| JP | 2014-230058 | A | 12/2014 |
| JP | 2015-091092 | A | 5/2015 |
| JP | 2016-525302 | A | 8/2016 |

\* cited by examiner

DRIVE CIRCUIT

CROSS REFERENCE TO RELATED APPLICATIONS

This application is a U.S. National Phase of International Patent Application No. PCT/JP2021/048869 filed on Dec. 28, 2021, which claims priority benefit of Japanese Patent Application No. JP 2021-103715 filed in the Japan Patent Office on Jun. 23, 2021. Each of the above-referenced applications is hereby incorporated herein by reference in its entirety.

TECHNICAL FIELD

The present technology relates to a drive circuit. Specifically, the present invention relates to a drive circuit that outputs a signal.

BACKGROUND ART

Conventionally, in a drive circuit on the transmission side of a communication interface, in addition to a driver, a voltage regulator is often disposed to control the amplitude of the driver. For example, a drive circuit in which a voltage regulator is provided on each of the power supply side and the ground side together with a driver has been proposed (cf. see Patent Document 1). The voltage regulator on the power supply side in the drive circuit generates the high level of the output of the driver from a predetermined reference voltage, and the voltage regulator on the ground side generates the low level of the output of the driver from the reference voltage.

CITATION LIST

Patent Document

Patent Document 1: Japanese Unexamined Patent Application No. 2016-525302

SUMMARY OF THE INVENTION

Problems to be Solved by the Invention

In the conventional technology described above, the voltage regulator is disposed on both the power supply side and the ground side to improve a power supply rejection ratio (PSRR). However, in the drive circuit described above, variations may occur in the amplitude and the common voltage of the output signal of the driver due to the input offset of an operational amplifier in the voltage regulator. These variations may degrade signal quality.

The present technology has been made in view of such a situation, and an object of the present technology is to improve signal quality in a drive circuit provided with a driver.

Solutions to Problems

The present technology has been made to solve the problem described above, and a first aspect of the present technology is a drive circuit including: a driver that outputs a differential signal; an amplitude adjuster that generates, from one of a pair of voltages, the other of the pair of voltages, and supplies the other of the pair of voltages to one of a power supply terminal and a ground terminal of the driver; and a common voltage adjuster that generates the one of the pair of voltages from an intermediate voltage between the pair of voltages, and supplies the one of the pair of voltages to the other of the power supply terminal and the ground terminal. This produces an effect that the amplitude and the common voltage are adjusted.

Further, in the first aspect, the common voltage adjuster includes a common-side reference voltage generator that generates a predetermined common-side reference voltage, and an operational amplifier that generates the one of the pair of voltages from the common-side reference voltage and the intermediate voltage. This produces an effect that one of the pair of voltages is generated from the common-side reference voltage and the intermediate voltage.

Further, in the first aspect, the common-side reference voltage generator includes a pair of first resistors connected in series between a power supply node and a ground node, and a voltage at a connection node of the pair of first resistors is supplied as the common-side reference voltage. This produces an effect that the power supply voltage is divided.

Further, in the first aspect, the common-side reference voltage generator includes a pair of first transistors connected in series between a power supply node and a ground node, and a voltage at a connection node of the pair of first transistors is supplied as the common-side reference voltage. This produces an effect that the power supply voltage is divided.

Further, in the first aspect, the common-side reference voltage generator includes a pair of first capacitors connected in series between a power supply node and a ground node, and a voltage at a connection node of the pair of first capacitors is supplied as the common-side reference voltage. This produces an effect that the difference between the power supply voltages is divided.

Further, in the first aspect, an intermediate voltage generator that generates the intermediate voltage from the pair of voltages may be further included. This produces an effect that an intermediate voltage is generated from the pair of voltages.

Further, in the first aspect, the intermediate voltage generator includes a pair of second resistors connected in series between the pair of voltages, and a voltage at a connection node of the pair of second resistors is supplied as the intermediate voltage. This produces an effect that the difference between the pair of voltages is divided.

Further, in the first aspect, the intermediate voltage generator includes a pair of second transistors connected in series between the pair of voltages, and a voltage at a connection node of the pair of second transistors is supplied as the intermediate voltage. This produces an effect that the difference between the pair of voltages is divided.

Further, in the first aspect, the intermediate voltage generator includes a pair of second capacitors connected in series between the pair of voltages, and a voltage at a connection node of the pair of second capacitors is supplied as the intermediate voltage. This produces an effect that the difference between the pair of voltages is divided.

Further, in the first aspect, the amplitude adjuster includes an amplitude-side reference voltage generator that generates a predetermined amplitude-side reference voltage, and a negative feedback circuit that generates the other of the pair of voltages from the amplitude-side reference voltage and the one of the pair of voltages. This produces an effect that the other of the pair of voltages is negatively fed back.

Further, in the first aspect, the amplitude-side reference voltage generator includes a current source and a third resistor connected in series between the one of the pair of voltages and one of a power supply node and a ground node, and a voltage at a connection node of the current source and the third resistor is supplied as the amplitude-side reference voltage. This produces an effect that a voltage corresponding to the current of the current source and the resistance value of the third resistor is generated.

Further, in the first aspect, the amplitude adjuster generates a higher voltage of the pair of voltages from a lower voltage of the pair of voltages, and supplies the higher voltage of the pair of voltages to the power supply terminal, and the common voltage adjuster generates the lower voltage of the pair of voltages from the intermediate voltage, and supplies the lower voltage of the pair of voltages to the ground terminal. This produces an effect that the amplitude adjuster is disposed on the power supply side and the common voltage adjuster is disposed on the ground side.

Further, in the first aspect, the amplitude adjuster generates a lower voltage of the pair of voltages from a higher voltage of the pair of voltages, and supplies the lower voltage of the pair of voltages to the ground terminal, and the common voltage adjuster generates the higher voltage of the pair of voltages from the intermediate voltage, and supplies the higher voltage of the pair of voltages to the power supply terminal. This produces an effect that the amplitude adjuster is disposed on the ground side and the common voltage adjuster is disposed on the power supply side.

Further, in the first aspect, the driver may be a source series terminated (SST)-type driver. This produces an effect that the voltage required for driving the driver is reduced, thus increasing the speed.

MODE FOR CARRYING OUT THE INVENTION

Modes for carrying out the present technology (hereinafter referred to as embodiments) will be described below. The description is given in the following order.

1. First embodiment (an example in which an amplitude adjuster is disposed on the power supply side and a common voltage adjuster is disposed on the ground side)
2. Second embodiment (an example in which an amplitude adjuster is disposed on the ground side and a common voltage adjuster is disposed on the power supply side)
3. Application example to mobile object 1. First Embodiment

[Configuration Example of Interface Circuit]

Figure 1:
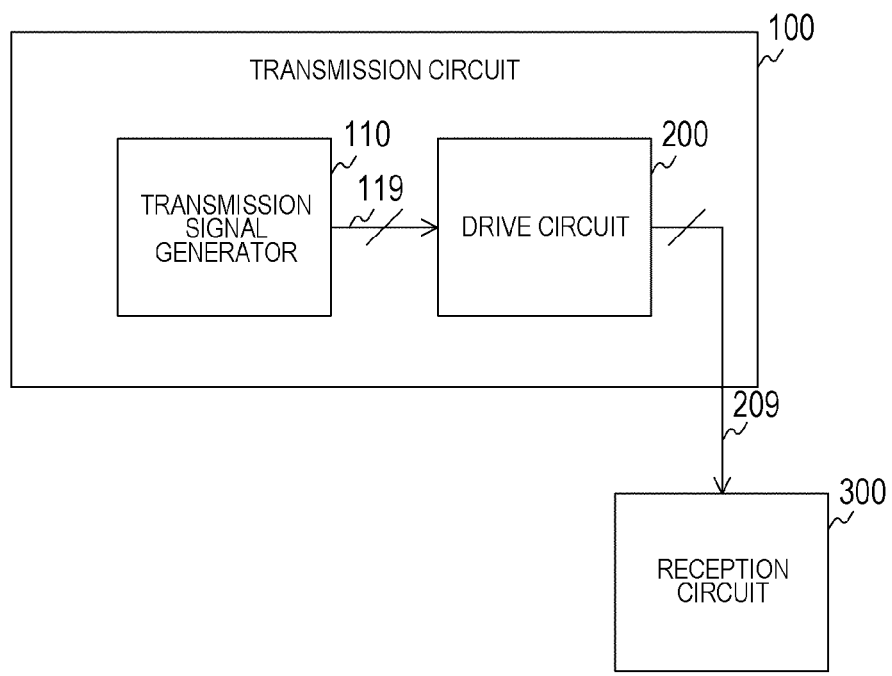
FIG. 1 is a block diagram illustrating a configuration example of an interface circuit according to a first embodiment of the present technology.

FIG. 1 is a block diagram illustrating a configuration example of an interface circuit according to an embodiment of the present technology. The interface circuit is a circuit for transmitting a signal, and includes a transmission circuit 100 and a reception circuit 300. In this interface circuit, for example, Low-voltage differential signaling (LVDS) is used.

The transmission circuit 100 is a circuit that transmits a signal, and includes a transmission signal generator 110 and a drive circuit 200.

The transmission signal generator 110 generates a signal to be transmitted. For example, the transmission signal generator 110 generates a differential signal and supplies the differential signal to the drive circuit 200 via a signal line 119.

The drive circuit 200 amplifies the differential signal from the transmission signal generator 110 and outputs the amplified differential signal to a transmission path 209. The reception circuit 300 receives the differential signal from the drive circuit 200 using a receiver or the like.

[Configuration Example of Drive Circuit]

Figure 2:
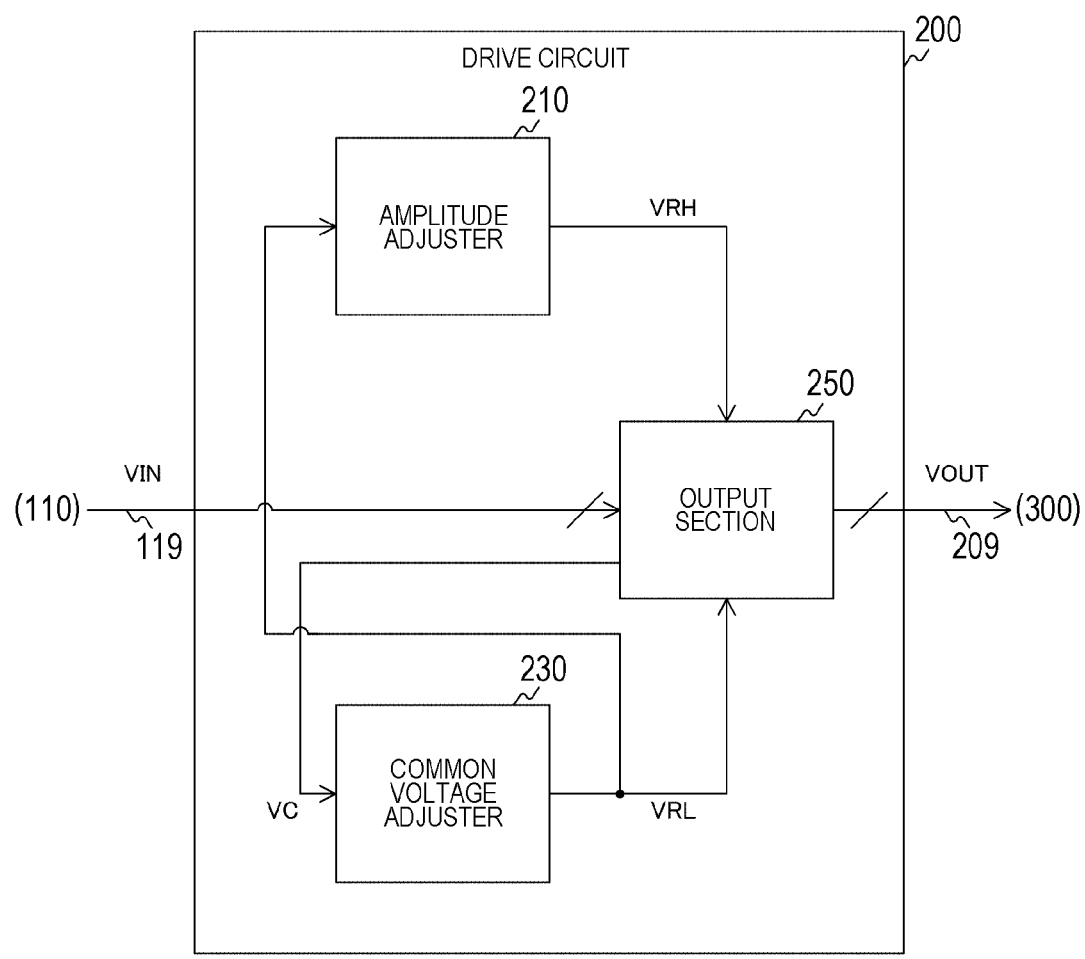
FIG. 2 is a block diagram illustrating a configuration example of a drive circuit according to the first embodiment of the present technology.

FIG. 2 is a block diagram illustrating a configuration example of the drive circuit 200 according to the first embodiment of the present technology. The drive circuit 200 includes an amplitude adjuster 210, a common voltage adjuster 230, and an output section 250.

The output section 250 generates a differential signal on the basis of an input signal VIN, which is a differential signal, and supplies the differential signal as an output signal VOUT to the reception circuit 300 via the transmission path 209. Further, a high voltage VRH is input to the power supply terminal of the output section 250, and a low voltage VRL is input to the ground terminal of the output section 250. Here, it is assumed that the low voltage VRL is lower than the high voltage VRH. Further, the output section 250 generates an intermediate voltage VC between the high voltage VRH and the low voltage VRL, and supplies the intermediate voltage VC to the common voltage adjuster 230. Note that the high voltage VRH and the low voltage VRL are an example of a pair of voltages recited in the claims.

The amplitude adjuster 210 adjusts the amplitude of an output signal VOUT (i.e., differential signal). The amplitude adjuster 210 generates the high voltage VRH from the low voltage VRL and supplies the high voltage VRH to the power supply terminal of the output section 250.

The common voltage adjuster 230 adjusts the common voltage of the differential signal. The common voltage adjuster 230 generates the low voltage VRL from the intermediate voltage VC and supplies the low voltage VRL to the ground terminal of the output section 250.

Figure 3:
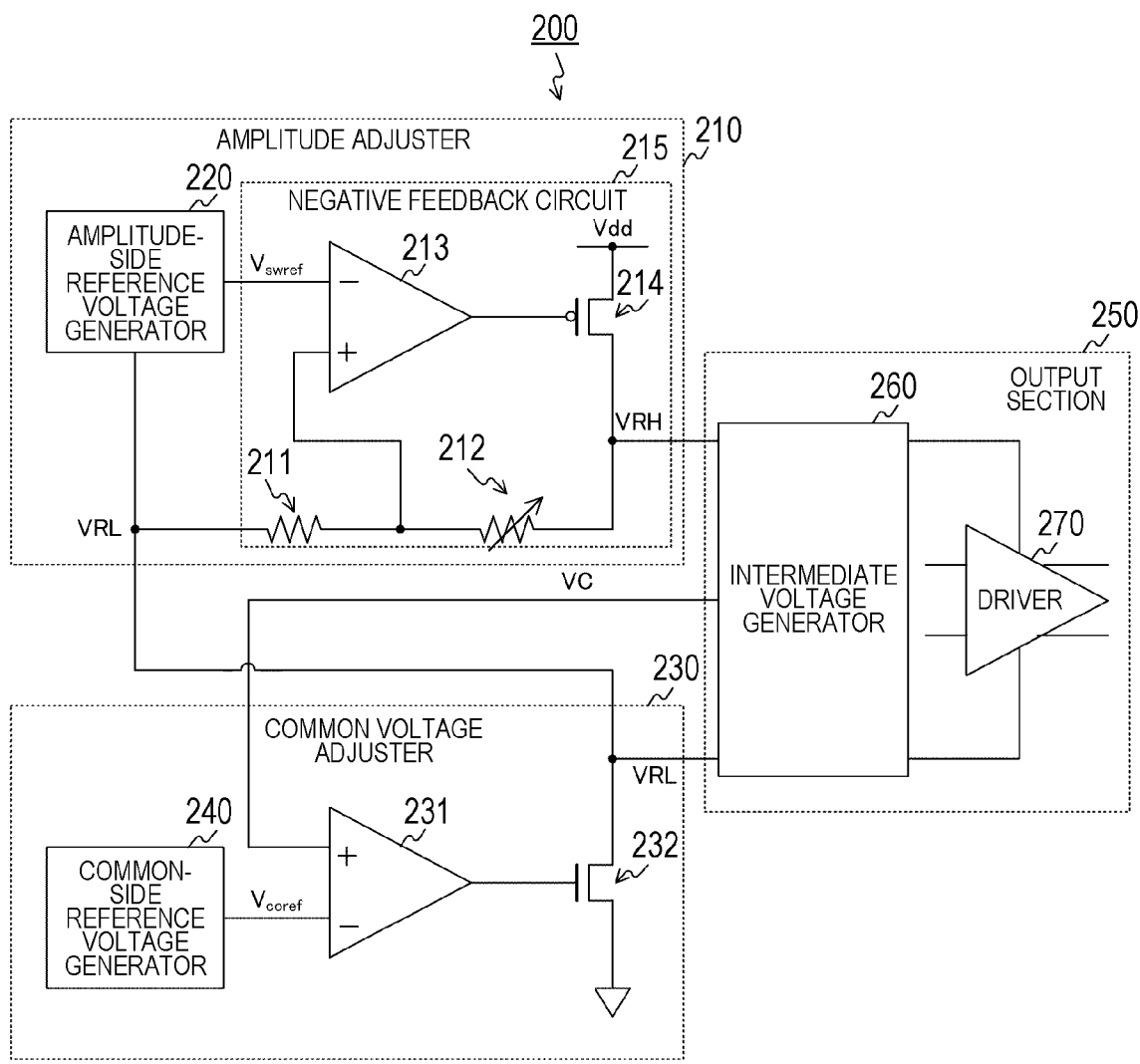
FIG. 3 is a circuit diagram illustrating a configuration example of an amplitude adjuster, a common voltage adjuster, and an output section according to the first embodiment of the present technology.

FIG. 3 is a circuit diagram illustrating a configuration example of the amplitude adjuster 210, the common voltage adjuster 230, and the output section 250 according to the first embodiment of the present technology. The amplitude adjuster 210 includes an amplitude-side reference voltage generator 220 and a negative feedback circuit 215. The negative feedback circuit 215 includes a resistor 211, a variable resistor 212, an operational amplifier 213, and a p-channel metal-oxide semiconductor (pMOS) transistor 214.

The amplitude adjuster 210 generates a predetermined amplitude-side reference voltage $V_{swref}$ from the low voltage VRL.

The resistor 211 and the variable resistor 212 are connected in series between the node of the high voltage VRH and the node of the low voltage VRL.

The amplitude-side reference voltage $V_{swref}$ is input to the inverting input terminal (−) of the operational amplifier 213, and the non-inverting input terminal (+) thereof is connected to the connection node of the resistor 211 and the variable resistor 212. Further, the output terminal of the operational amplifier 213 is connected to the gate of the pMOS transistor 214.

The source of the pMOS transistor 214 is connected to the node of the power supply voltage Vdd, and the drain thereof is connected to the variable resistor 212. The voltage at the connection node of the pMOS transistor 214 and the variable resistor 212 is supplied to the output section 250 as the high voltage VRH.

Further, the common voltage adjuster 230 includes a common-side reference voltage generator 240, an operational amplifier 231, and an n-channel MOS (nMOS) transistor 232.

The common-side reference voltage generator 240 generates a predetermined common-side reference voltage $V_{coref}$.

The intermediate voltage VC is input to the non-inverting input terminal (+) of the operational amplifier 231, and the common-side reference voltage $V_{coref}$ is input to the non-inverting input terminal (−). Further, the output terminal of the operational amplifier 231 is connected to the gate of the nMOS transistor 232.

The source of the nMOS transistor 232 is connected to the ground node of the ground voltage. Further, the voltage at the drain of the nMOS transistor 232 is supplied to the amplitude adjuster 210 and the output section 250 as the low voltage VRL.

Further, the output section 250 includes an intermediate voltage generator 260 and a driver 270. The high voltage VRH from the amplitude adjuster 210 is supplied to the power supply terminal of the driver 270 via the intermediate voltage generator 260. Further, the low voltage VRL from the common voltage adjuster 230 is supplied to the ground terminal of the driver 270 via the intermediate voltage generator 260.

The intermediate voltage generator 260 generates the intermediate voltage VC from the high voltage VRH and the low voltage VRL. The driver 270 generates and outputs a differential output signal on the basis of a differential input signal.

Figure 4:
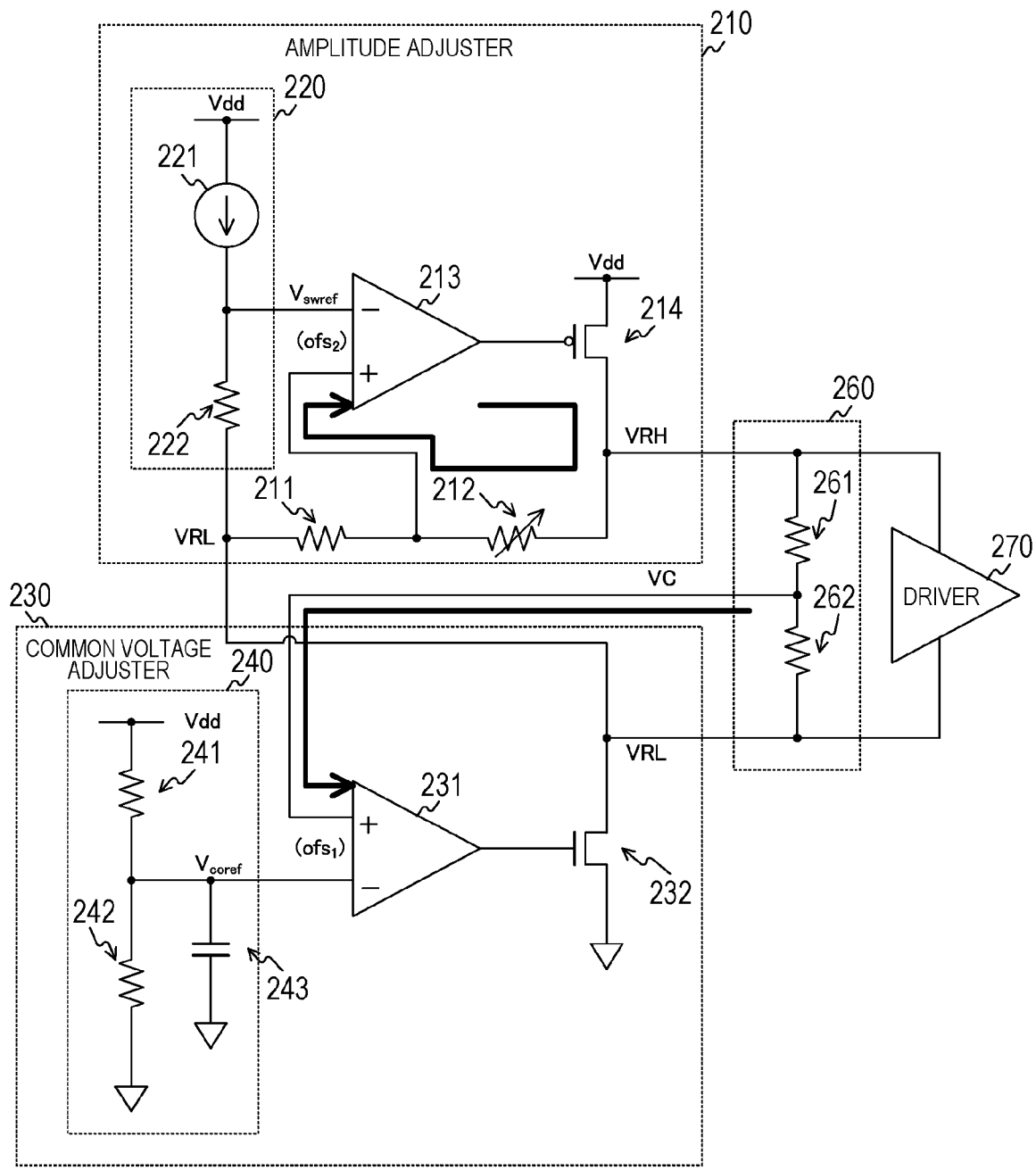
FIG. 4 is a circuit diagram illustrating a configuration example of an amplitude-side reference voltage generator, a common-side reference voltage generator, and an intermediate voltage generator according to the first embodiment of the present technology.

FIG. 4 is a circuit diagram illustrating a configuration example of the amplitude-side reference voltage generator 220, the common-side reference voltage generator 240, and the intermediate voltage generator 260 according to the first embodiment of the present technology.

The amplitude-side reference voltage generator 220 includes, for example, a current source 221 and a resistor 222. The current source 221 and the resistor 222 are connected in series between the power supply node the power supply voltage Vdd and the node of the low voltage VRL with the current source 221 as a power supply side. In addition, the voltage at the connection node of the current source 221 and the resistor 222 is supplied to the operational amplifier 213 as the amplitude-side reference voltage $V_{swref}$. Note that the resistor 222 is an example of a third resistor recited in the claims.

Further, the common-side reference voltage generator 240 includes, for example, resistors 241, 242 and a capacitor 243. The resistors 241, 242 are connected in series between the power supply node and the ground node. The capacitor 243 is inserted between the connection node of the resistors 241, 242 and the ground node. The voltage at the connection node of the resistors 241, 242 is supplied to the operational amplifier 231 as a common-side reference voltage $V_{coref}$. Note that the resistors 241, 242 are examples of first resistors recited in the claims.

Further, the intermediate voltage generator 260 includes, for example, resistors 261, 262 having substantially the same resistance value. These resistors are connected in series between the high voltage VRH and the low voltage VRL. In addition, the voltage at the connection node of the resistors 261, 262 is supplied to the operational amplifier 231 as the intermediate voltage VC. Note that the resistors 261, 262 are examples of second resistors recited in the claims.

With the circuit configuration illustrated in the drawing, in the amplitude adjuster 210, the high voltage VRH is negatively fed back to the non-inverting input terminal (+) of the operational amplifier 213, and the amplitude is adjusted by this negative feedback circuit. Further, in the common voltage adjuster 230, the low voltage VRL is negatively fed back to the non-inverting input terminal (+) of the operational amplifier 231, and the common voltage is adjusted by this negative feedback circuit. A thick line in the drawing indicates a negative feedback path.

When the value of the current supplied by the current source 221 is I', and the resistance value of the resistor 222 is R', the amplitude-side reference voltage $V_{swref}$ is expressed by the following equation:

$$V_{swref} = VRL + I'R' \qquad \text{Equation 1}$$

Further, when the resistance value of the resistor 211 is $R_1$, and the resistance value of the variable resistor 212 is $R_2$ due to the negative feedback on the amplitude adjuster 210 side, the voltage $V_+$ of the non-inverting input terminal (+) of the operational amplifier 213 is expressed by the following equation:

$$V_+ = (R_1 \cdot VRH + R_2 \cdot VRL)/(R_1 + R_2) \quad \text{Equation 2}$$

In addition, an input offset $ofs_2$ of the operational amplifier 213 is expressed by the following equation:

$$ofs_2 = V_+ - V_{swref} \quad \text{Equation 3}$$

Substituting Equations 1 and 2 into Equation 3 and performing transformation yields the following equation:

$$VRH = \{(R_1 + R_2)/R_1\}(I'R' + ofs_2) + VRL \quad \text{Equation 4}$$

Further, from Equation 4, a difference (i.e., the amplitude) $\Delta V$ between the high voltage VRH and the low voltage VRL is expressed by the following equation:

$$\Delta V = \{(R_1 + R_2)/R_1\}(I'R' + ofs_2) \quad \text{Equation 5}$$

On the basis of Equation 5, the offset component of the amplitude $\Delta V$ is expressed by the following equation:

$$\{(R_1 + R_2)/R_1\}ofs_2 \quad \text{Equation 6}$$

Further, when the respective resistance values of the resistors 241, 242 are substantially the same, the common-side reference voltage $V_{coref}$ is expressed by the following equation:

$$V_{coref} = Vdd/2 \quad \text{Equation 7}$$

Further, an input offset $ofs_1$ of the operational amplifier 231 is expressed by the following equation:

$$ofs_1 = VC - V_{coref} \quad \text{Equation 8}$$

Substituting Equation 7 into Equation 8 yields the following equation:

$$VC = Vdd/2 + ofs_1 \quad \text{Equation 9}$$

Further, from the negative feedback on the common voltage adjuster 230 side, the intermediate voltage VC is expressed by the following equation:

$$VC = VRL + \Delta V/2 \quad \text{Equation 10}$$

Substituting Equations 5 and 9 into Equation 10 and performing transformation yields the following equation:

$$VRL = Vdd/2 + ofs_1 - \{(R_1 + R_2)/2R_1\}(I'R' + ofs_2) \quad \text{Equation 11}$$

Substituting Equation 11 into Equation 4 yields the following equation:

$$VRH = Vdd/2 + ofs_1 + \{(R_1 + R_2)/2R_1\}(I'R' + ofs_2) \quad \text{Equation 12}$$

From Equations 11 and 12, the offset component of the common voltage is $ofs_1$.

[Configuration Example of Driver]

Figure 5:
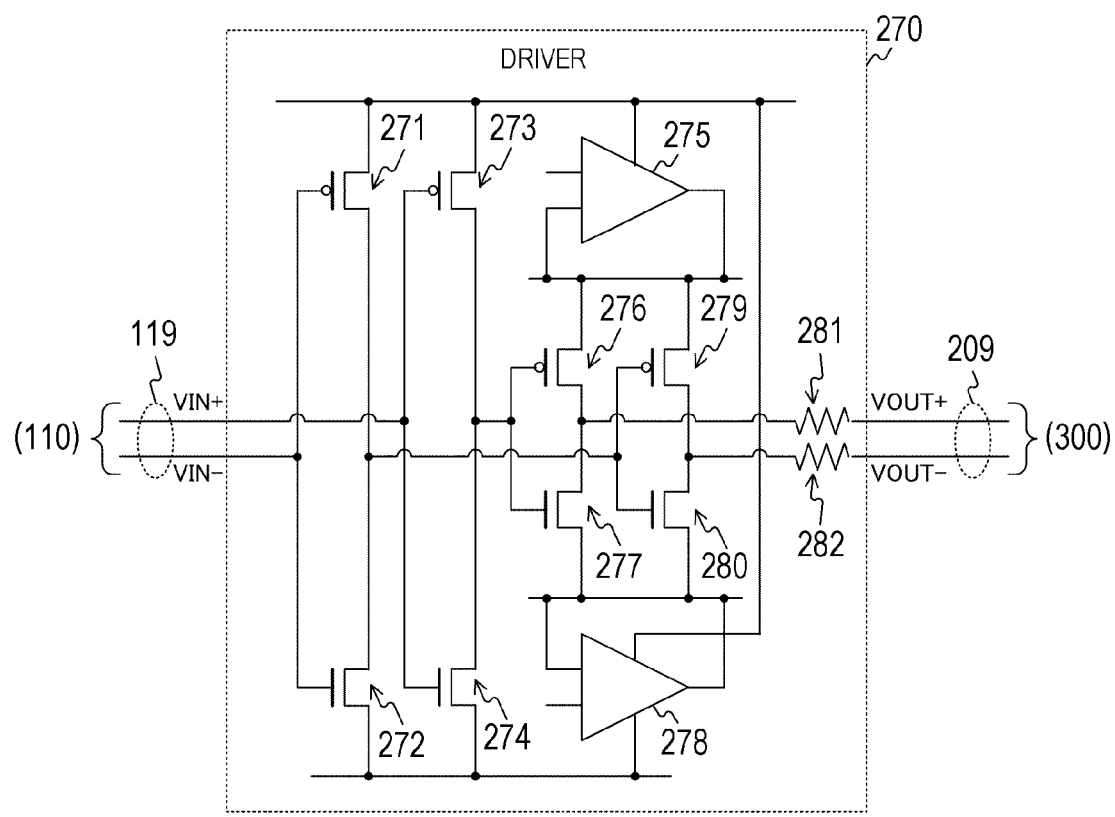
FIG. 5 is a circuit diagram illustrating a configuration example of a driver according to the first embodiment of the present technology.

FIG. 5 is a circuit diagram illustrating a configuration example of the driver 270 according to the first embodiment of the present technology. The driver 270 includes pMOS transistors 271, 273, 276, 279 and nMOS transistors 272, 274, 277, 280. Moreover, the driver 270 includes regulators 275, 278, resistors 281, 282.

The pMOS transistor 271 and the nMOS transistor 272 are connected in series between the power supply node and the ground node, and function as a first-stage inverter. The pMOS transistor 273 and the nMOS transistor 274 are connected in series between the power supply node and the ground node, and function as a second-stage inverter.

The regulator 275 controls the voltages of the sources of the pMOS transistors 276, 279 to be constant. The regulator 278 controls the voltages of the sources of the nMOS transistors 277, 280 to be constant.

The pMOS transistor 276 and the nMOS transistor 277 are connected in series between the regulators 275, 278, and function as a third-stage inverter. The pMOS transistor 279 and the nMOS transistor 280 are connected in series between the regulators 275, 278, and function as a fourth-stage inverter.

A negative-side input signal VIN-is input to the first-stage inverter, and the output of the inverter is input to the fourth-stage inverter. A positive-side input signal VIN-is input to the second-stage inverter, and the output of the inverter is input to the third-stage inverter.

The output of the third-stage inverter is connected to one end of the resistor 281, and the positive-side output signal VOUT+ is output from the other end of the resistor 281. The output of the fourth-stage inverter is connected to one end of the resistor 282, and the negative-side output signal VOUT− is output from the other end of the resistor 282.

As illustrated in the drawing, the driver 270 with a circuit configuration in which a termination resistor (i.e., resistors 281, 282) is inserted in series with an output of a subsequent circuit (third-stage and fourth-stage inverters) is called a source-series-terminated (SST)-type driver. The SST type can be driven at a lower voltage and at a higher speed than the nMOS type to be described later, so that drivers for performing serial data communication are shifting from the NMOS type to the SST type. However, the SST-type driver has a problem of larger variations in the offset component of the common voltage. In particular, error deterioration is noticeable at high amplitudes with large gain settings. Therefore, it is required to adjust the common voltage and reduce its variations, especially in the case of using the SST-type driver.

Here, a drive circuit with a configuration in which the amplitude adjuster 210 and the common voltage adjuster 230 are not arranged is assumed as a comparative example.

Figure 6:
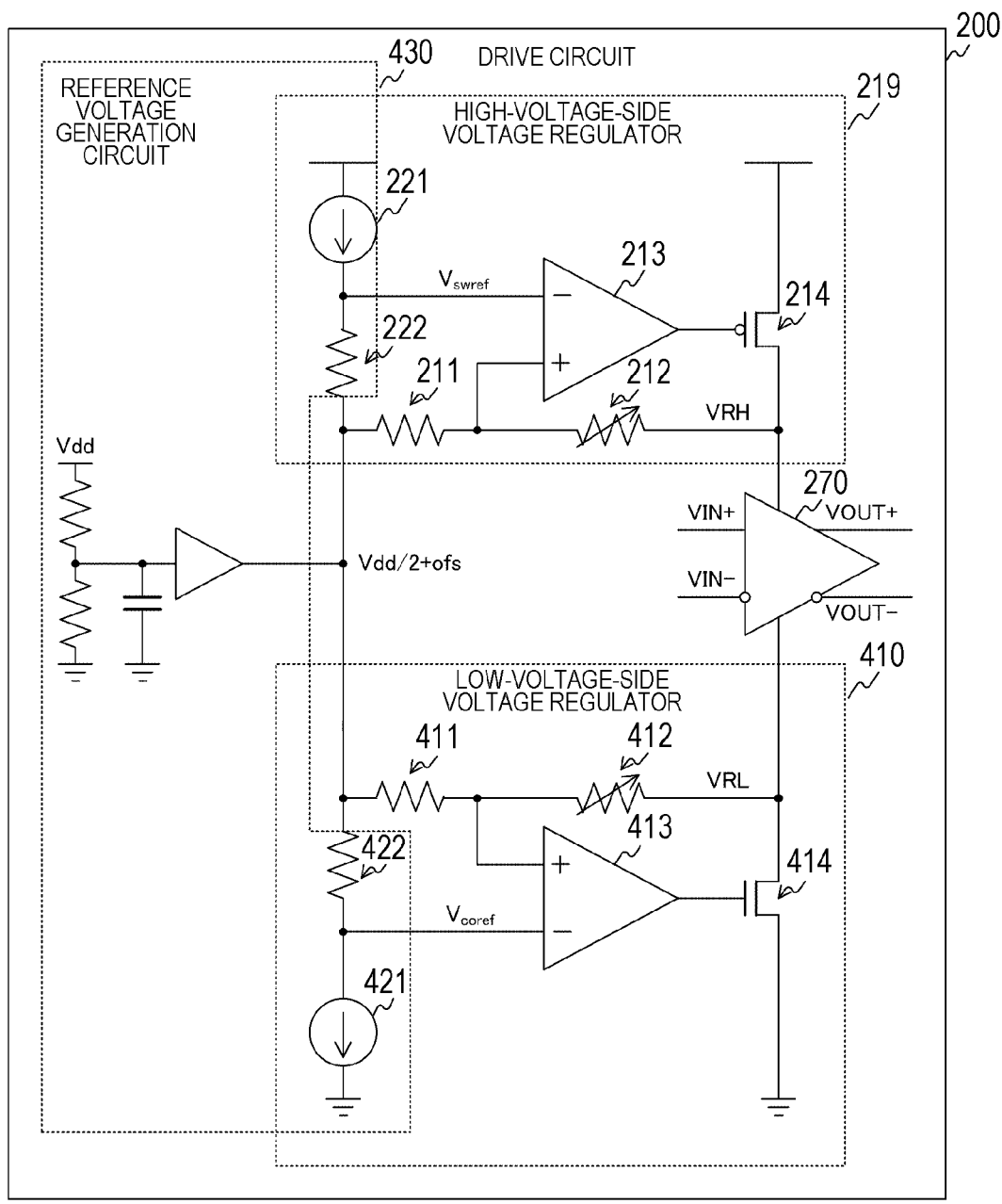
FIG. 6 is a circuit diagram illustrating a configuration example of a drive circuit in a comparative example.

FIG. 6 is a circuit diagram illustrating a configuration example of a drive circuit 200 in the comparative example. The drive circuit 200 of the comparative example includes a high-voltage-side voltage regulator 219, a low-voltage-side voltage regulator 410, a reference voltage generation circuit 430, and a driver 270. The high-voltage-side voltage regulator 219 includes a current source 221, a resistor 222, a resistor 211, a variable resistor 212, an operational amplifier 213, and a pMOS transistor 214. A connection configuration of these elements is similar to that in the amplitude adjuster 210. However, the connection node of the resistor 222 and the resistor 211 is not connected to the node of the low voltage VRL, and a reference voltage $V_{ref}$ expressed by the following equation is input:

$$V_{ref} = Vdd/2 + ofs \qquad \text{Equation 13}$$

In the above equation, ofs is an input offset of an operational amplifier in the reference voltage generation circuit 430.

Replacing VRL in Equation 4 with $V_{ref}$ in Equation 13 yields the following equation:

$$VRH = \{(R_1 + R_2)/R_1\}(I'R' + ofs_2) + Vdd/2 + ofs \qquad \text{Equation 14}$$

In addition, the low-voltage-side voltage regulator 410 includes a current source 421, a resistor 422, a resistor 411, a variable resistor 412, an operational amplifier 413, and an nMOS transistor 414. The connection configuration of these elements is vertically symmetric with the high-voltage-side voltage regulator 219. That is, the resistor 422 is inserted into the power supply side. Further, the connection node of the current source 421 and the resistor 422 is connected to the inverting input terminal (−) of the operational amplifier 413, and the connection node of the resistor 411 and the variable resistor 412 is connected to the non-inverting input terminal (+) of the operational amplifier 413. In addition, the low-voltage-side voltage regulator 410 supplies the low voltage VRL to the driver 270.

The current values and resistance values of the current source 421, the resistor 422, the resistor 411, and the variable resistor 412 are similar to those of the current source 221, the resistor 222, the resistor 211, and the variable resistor 212, and the input offset of the operational amplifier 413 is $ofs_1$. In this case, the following equation is obtained:

$$VRL = \{(R_1 + R_2)/R_1\}(-I'R' + ofs_1) + Vdd/2 + ofs \qquad \text{Equation 15}$$

The offset component of the amplitude on the basis of Equations 14 and 15 is expressed by the following equation:

$$\{(R_1 + R_2)/R_1\}ofs_2 - \{(R_1 + R_2)/R_1\}ofs_1 \qquad \text{Equation 16}$$

Further, the offset component of the common voltage is expressed by the following equation:

$$\{(R_1 + R_2)/2R_1\}ofs_2 + \{(R_1 + R_2)/2R_1\}ofs_1 + ofs \qquad \text{Equation 17}$$

From Equations 6 and 16, the influence of the input offset $ofs_1$ on the ground side can be canceled from the offset component of the amplitude by providing the amplitude adjuster 210 that refers to the low voltage VRL. In contrast, in the comparative example where the low voltage VRL is not referred to, the influence of the input offset $ofs_1$ cannot be canceled. Thus, the latter case has larger variations in amplitude due to offset.

In addition, from Equation 17, the influence of the input offsets ofs and $ofs_2$ can be canceled from the offset component of the common voltage by providing the common voltage adjuster 230 that refers to the intermediate voltage. In contrast, in the comparative example where the intermediate voltage is not referred to, the influence of the input offsets ofs and $ofs_2$ cannot be canceled. Thus, the latter case has larger variations in common voltage due to offset. Especially in the case of using the SST-type driver, variations in common voltage are problematic.

Note that, although the resistors 241, 242 are arranged in the common-side reference voltage generator 240, the present invention is not limited to this circuit configuration.

Figure 7A:
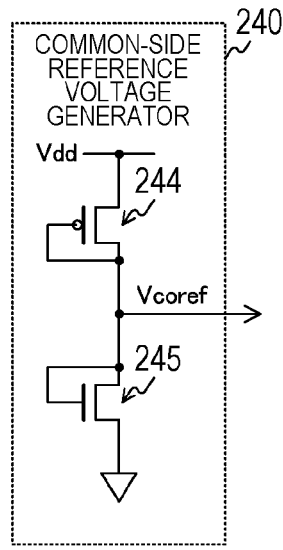
FIGS. 7A, 7B, 7C, and 7D are circuit diagrams illustrating a configuration example of the common-side reference voltage generator according to the first embodiment of the present technology.

For example, as illustrated in FIG. 7A of FIGS. 7A, 7B, 7C, and 7D, a pMOS transistor 244 and a nMOS transistor 245 connected in series between the power supply node and the ground node can also be arranged. These transistors are diode-connected and have substantially the same on-resistances. In addition, the voltage at the connection node of the pMOS transistor 244 and the nMOS transistor 245 is supplied as the common-side reference voltage Vcoref.

Figure 7B:
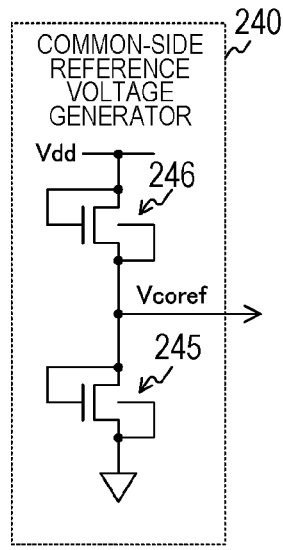

Further, as illustrated in FIG. 7B of the drawing, the pMOS transistor 244 in FIG. 7A of the drawing can be replaced with an nMOS transistor 246.

Figure 7C:
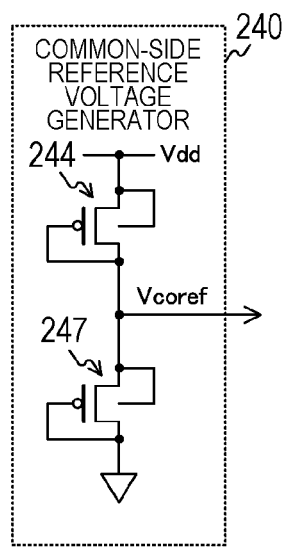

Further, as illustrated in FIG. 7C of the drawing, the nMOS transistor 245 in FIG. 7A of the drawing can be replaced with a pMOS transistor 247. Note that the pMOS transistor 244, the nMOS transistor 245, the nMOS transistor 246, and the pMOS transistor 247 are examples of first transistors recited in the claims.

Figure 7D:
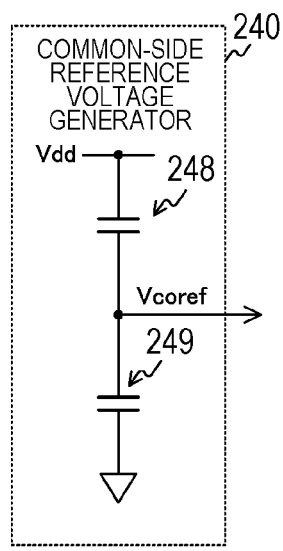

In addition, as illustrated in FIG. 7D of the drawing, capacitors 248, 249 connected in series between the power supply node and the ground node can be arranged. The values of these capacitors are substantially the same, and the voltage at the connection node of the capacitors 248, 249 is supplied as the common-side reference voltage Vcoref. Note that the capacitors 248, 249 are examples of first capacitors recited in the claims.

Further, although the resistors 261, 262 are arranged in the intermediate voltage generator 260, the present invention is not limited to this circuit configuration.

Figure 8A:
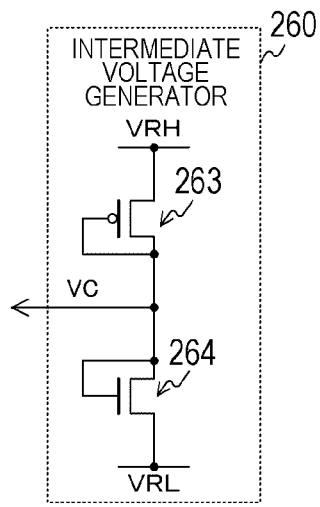
FIGS. 8A, 8B, 8C, and 8D are circuit diagrams illustrating a configuration example of the intermediate voltage generator according to the first embodiment of the present technology.

For example, as illustrated in FIG. 8A of FIGS. 8A, 8B, 8C, and 8D, a pMOS transistor 263 and an nMOS transistor 264 connected in series between the node of the high voltage VRH and the node of the low voltage VRL can also be arranged. These transistors are diode-connected and have substantially the same on-resistances. In addition, the voltage at the connection node of the pMOS transistor 263 and the nMOS transistor 264 is supplied as the intermediate voltage VC.

Figure 8B:
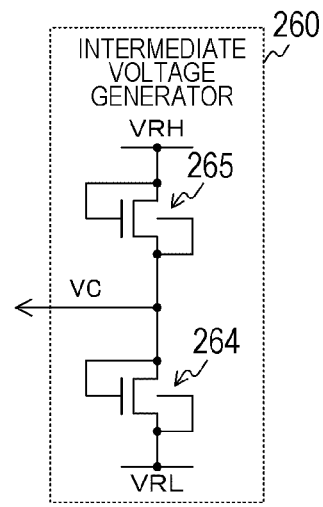

Further, as illustrated in FIG. 8B of the drawing, the pMOS transistor 263 in FIG. 8A of the drawing can be replaced with an nMOS transistor 265.

Figure 8C:
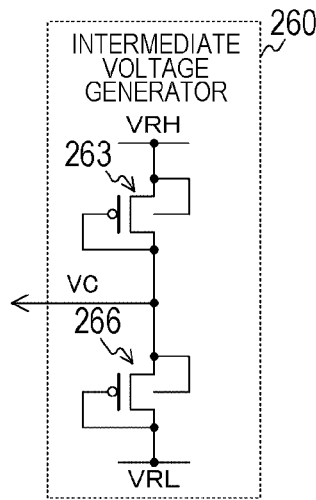

Further, as illustrated in FIG. 8C of the drawing, the nMOS transistor 264 in FIG. 8A of the drawing can be replaced with a pMOS transistor 266. Note that the pMOS transistor 263, the nMOS transistor 264, the nMOS transistor 265, and the pMOS transistor 266 are examples of second transistors recited in the claims.

Figure 8D:
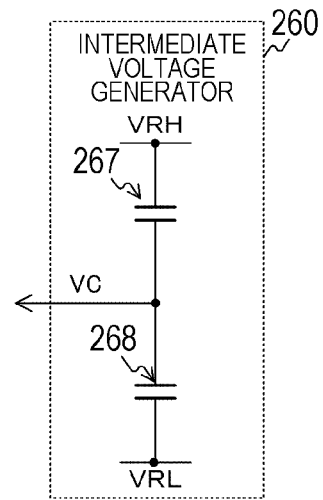

In addition, as illustrated in FIG. 8D of the drawing, capacitors 267, 268 connected in series between the node of the high voltage VRH and the node of the low voltage VRL can be arranged. The values of these capacitor are substantially the same, and the voltage at the connection node of the capacitors 267, 268 is supplied as the intermediate voltage VC. Note that the capacitors 267, 268 are examples of second capacitors recited in the claims.

Any combination is possible between each of the circuits of the common-side reference voltage generators 240 in FIGS. 4, 7A, 7B, 7C, and 7D and each of the circuits of the intermediate voltage generators 260 in FIGS. 4, 8A, 8B, 8C, and 8D.

Figure 9A:
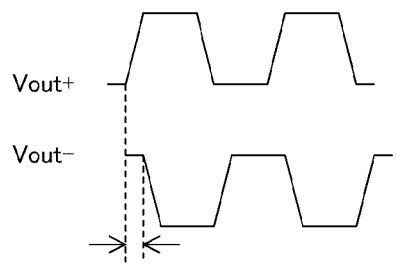
FIGS. 9A, 9B, 9C, 9D, 9E, 9F, 9G, and 9H are diagrams illustrating an example of waveforms of a differential signal and a common voltage component according to the first embodiment of the present technology.
Figure 9C:
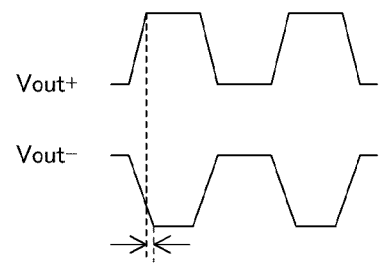
Figure 9B:

FIGS. 9A, 9B, 9C, 9D, 9E, 9F, 9G, and 9H are diagrams illustrating an example of waveforms of a differential signal and a common voltage component according to the first embodiment of the present technology. In the drawing, FIG. 9A illustrates waveforms of the output signals VOUT+, VOUT− in a case where there is a shift in translation timing therebetween. In the drawing, FIG. 9B illustrates a waveform of a common voltage component corresponding to FIG. 9A in the drawing.

Figure 9D:

In the drawing, FIG. 9C illustrates waveforms of the output signals VOUT+, VOUT− in a case where there is a shift in rise time therebetween. In the drawing, FIG. 9D illustrates a waveform of a common voltage component corresponding to FIG. 9C in the drawing.

Figure 9E:
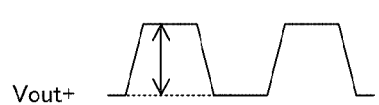

In the drawing, FIG. 9E illustrates waveforms of the output signals VOUT+, VOUT− in a case where there is a shift in amplitude. A waveform FIG. 9F in the drawing indicates a waveform of a common voltage component corresponding to FIG. 9E in the drawing.

Figure 9G:
Figure 9F:
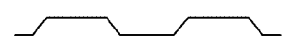
Figure 9H:
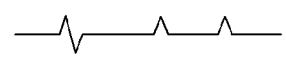

In the drawing, FIG. 9G illustrates waveforms of the output signals VOUT+, VOUT− on each of which common mode noise is superimposed. In the drawing, FIG. 9H illustrates a waveform of a common voltage component corresponding to FIG. 9G in the drawing.

As illustrated in the drawing, the shifts in timing, amplitude, and rise time, as well as common mode noise, cause fluctuations in common voltage component, resulting in external radiation of electromagnetic interference (EMI).

As described above, disposing the common voltage adjuster 230 can inhibit the fluctuations in common voltage and reduce the EMI.

Figure 10:
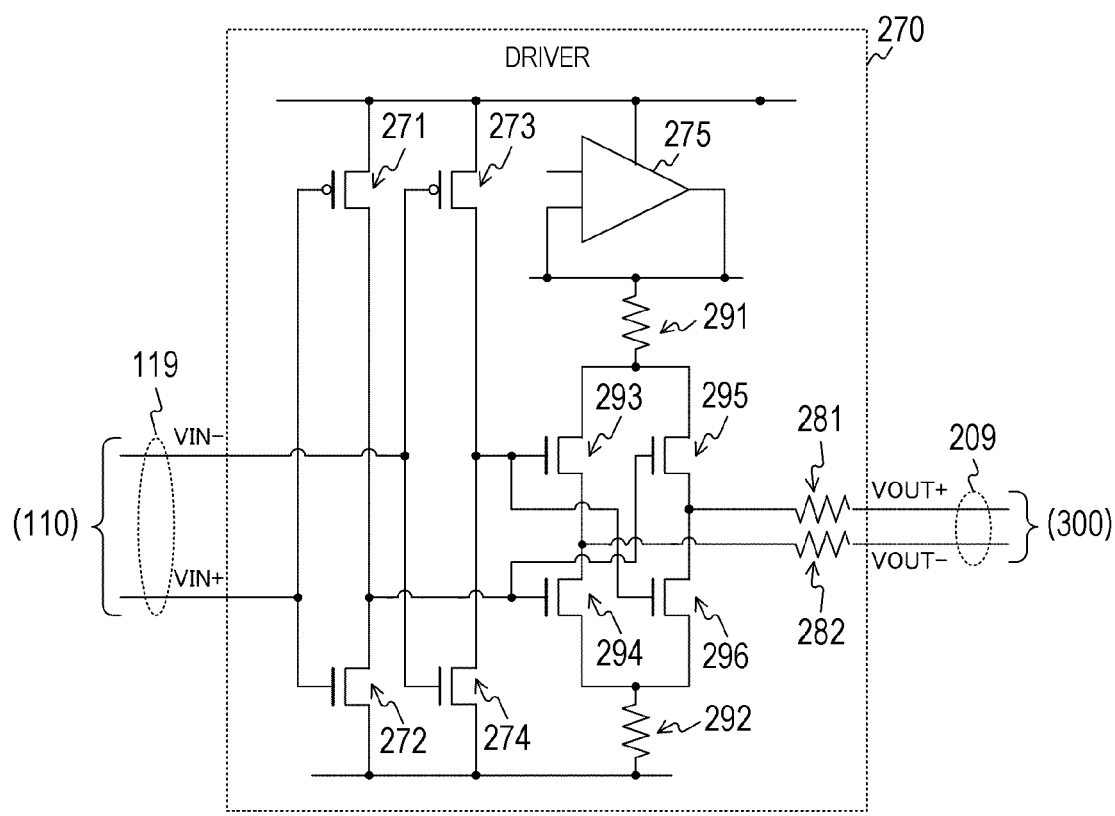
FIG. 10 is a circuit diagram illustrating another example of the driver according to the first embodiment of the present technology.

Note that, although the SST-type driver has been used as the driver 270, an nMOS-type driver can also be used as illustrated in FIG. 10. In this case, resistors 291, 292 and nMOS transistors 293 to 296 are arranged instead of the third-stage and fourth-stage inverters and the regulator 278.

In the nMOS type, one end of the resistor 291 is connected to the regulator 275, and the other end thereof is commonly connected to the drains of the nMOS transistors 293, 295. One end of the resistor 292 is connected to the ground node, and the other end thereof is commonly connected to the respective sources of the nMOS transistors 294, 296.

Further, the nMOS transistors 293, 294 are connected in series between the resistors 291, 292. The nMOS transistors 295, 296 are connected in series between the resistors 291, 292. In addition, the output of the first-stage inverter is input to the gates of the nMOS transistors 294 and 295, and the output of the second-stage inverter is input to the gates of the nMOS transistors 293 and 296. The connection node of the nMOS transistors 293, 294 is connected to the resistor 282, and the connection node of the nMOS transistors 295, 296 is connected to the resistor 281.

As described above, according to the first embodiment of the present technology, the common voltage adjuster 230 generates the low voltage VRL from the intermediate voltage VC and supplies the low voltage VRL to the ground terminal of the driver 270, so that variations in common voltage can be inhibited. This enables improvement in the quality of the output signal.

2. Second Embodiment

In the first embodiment described above, the amplitude adjuster 210 generates the high voltage VRH, and the common voltage adjuster 230 generates the low voltage VRL. However, conversely, the amplitude adjuster 210 can generate the low voltage VRL, and the common voltage adjuster 230 can generate the high voltage VRH. The drive circuit 200 of the second embodiment differs from that of the first embodiment in that the amplitude adjuster 210 generates the low voltage VRL, and the common voltage adjuster 230 generates the high voltage VRH.

Figure 11:
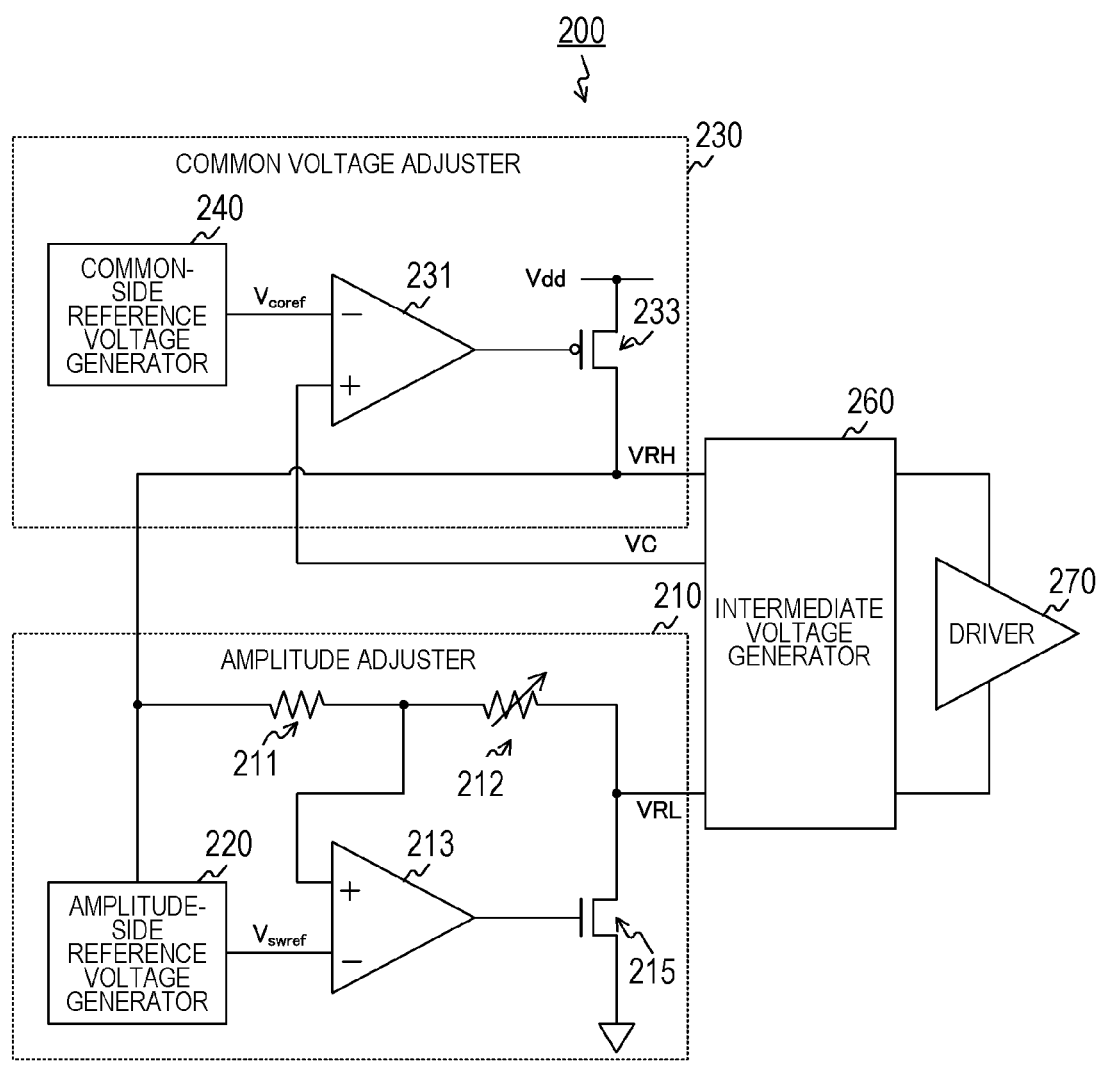
FIG. 11 is a block diagram illustrating a configuration example of a drive circuit according to a second embodiment of the present technology.

FIG. 11 is a block diagram illustrating a configuration example of the drive circuit 200 according to the second embodiment of the present technology. The drive circuit 200 of the second embodiment differs from that of the first embodiment in that the amplitude adjuster 210 generates the low voltage VRL from the high voltage VRH and supplies the low voltage VRL to the ground terminal of the driver 270. Further, the drive circuit 200 of the second embodiment differs from that of the first embodiment in that the common voltage adjuster 230 generates the high voltage VRH from the intermediate voltage VC and supplies the generated high voltage VRH to the power supply terminal of the driver 270. In addition, in the amplitude adjuster 210, an nMOS transistor 215 is disposed instead of the pMOS transistor, and in the common voltage adjuster 230, a pMOS transistor 233 is disposed instead of the nMOS transistor.

As illustrated in the drawing, disposing the amplitude adjuster 210 on the ground side can cancel the influence of the input offset of the operational amplifier on the power supply side in the amplitude. Also, disposing the common voltage adjuster 230 on the power supply side can cancel the influence of the input offset of the operational amplifier on the ground side in the common voltage.

Figure 12:
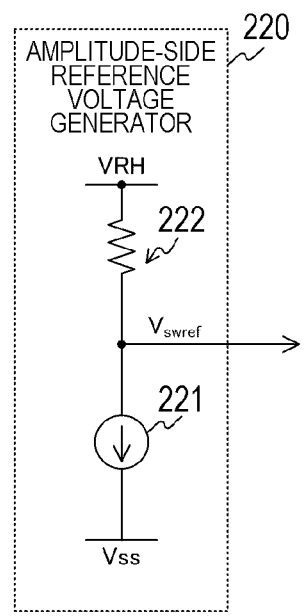
FIG. 12 is a circuit diagram illustrating a configuration example of an amplitude-side reference voltage generator according to the second embodiment of the present technology.

FIG. 12 is a circuit diagram illustrating a configuration example of the amplitude-side reference voltage generator 220 according to the second embodiment of the present technology. The amplitude-side reference voltage generator 220 in the second embodiment differs from that in the first embodiment in that a current source 221 is disposed on the ground side.

As described above, according to the second embodiment of the present technology, since the amplitude adjuster 210 is disposed on the ground side, it is possible to cancel the influence of the input offset of the operational amplifier on the power supply side in the amplitude. Also, since the common voltage adjuster 230 is disposed on the power supply side, it is possible to cancel the influence of the input offset of the operational amplifier on the ground side in the common voltage.

3. Application Example to Mobile Object

The technology according to the present disclosure (present technology) can be applied to various products. For example, the technology according to the present disclosure may be achieved as a device mounted on any type of mobile body, such as an automobile, an electric vehicle, a hybrid electric vehicle, a motorcycle, a bicycle, a personal mobility, an airplane, a drone, a boat, or a robot.

Figure 13:
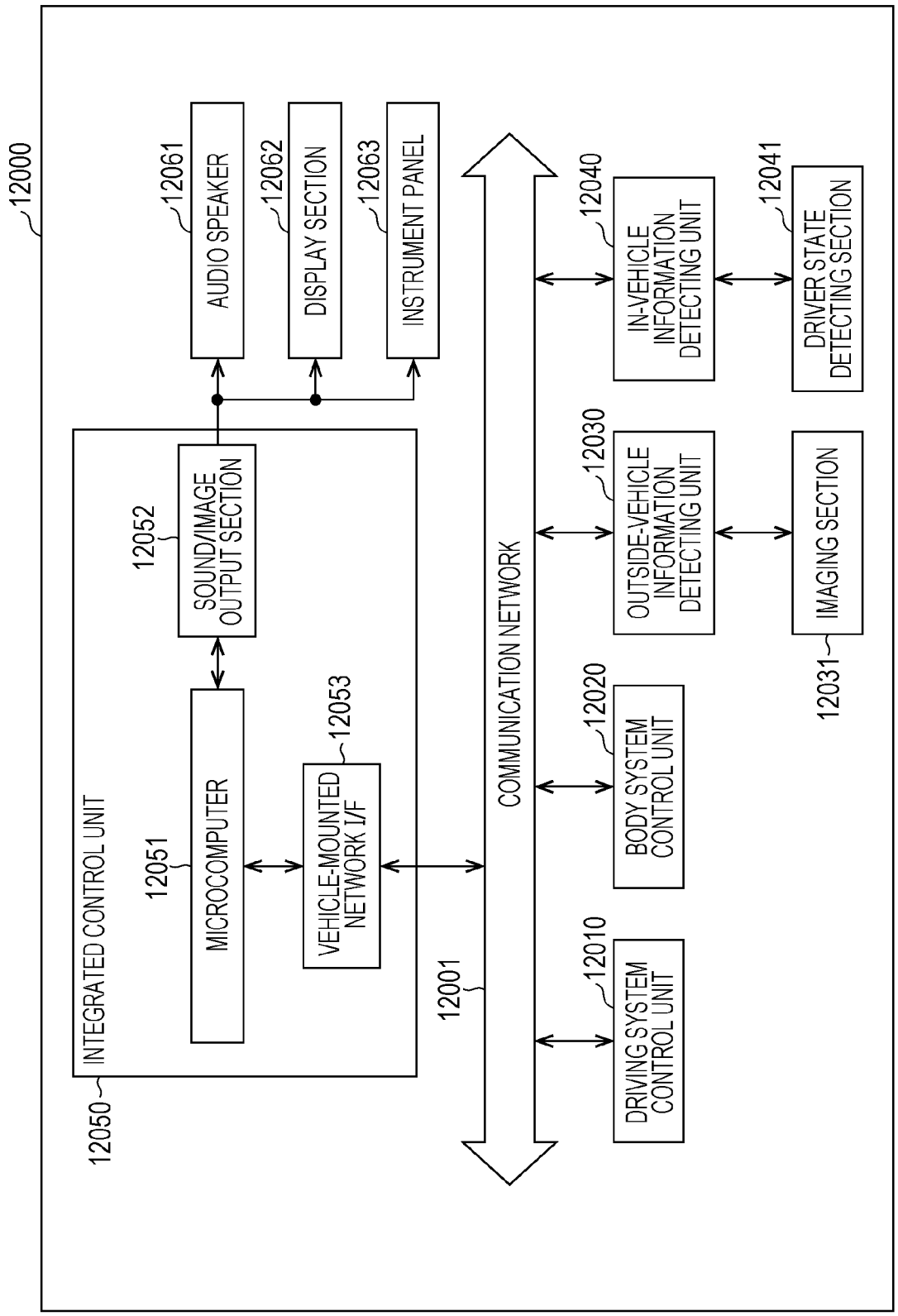
FIG. 13 is a block diagram illustrating a schematic configuration example of a vehicle control system.

FIG. 13 is a block diagram illustrating a schematic configuration example of a vehicle control system being an example of a mobile body control system to which the technology according to the present disclosure can be applied.

The vehicle control system 12000 includes a plurality of electronic control units connected to each other via a communication network 12001. In the example illustrated in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Further, the microcomputer 12051 can output a control command to the body system control unit 12020 on the basis of the information about the outside of the vehicle obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

Figure 14:
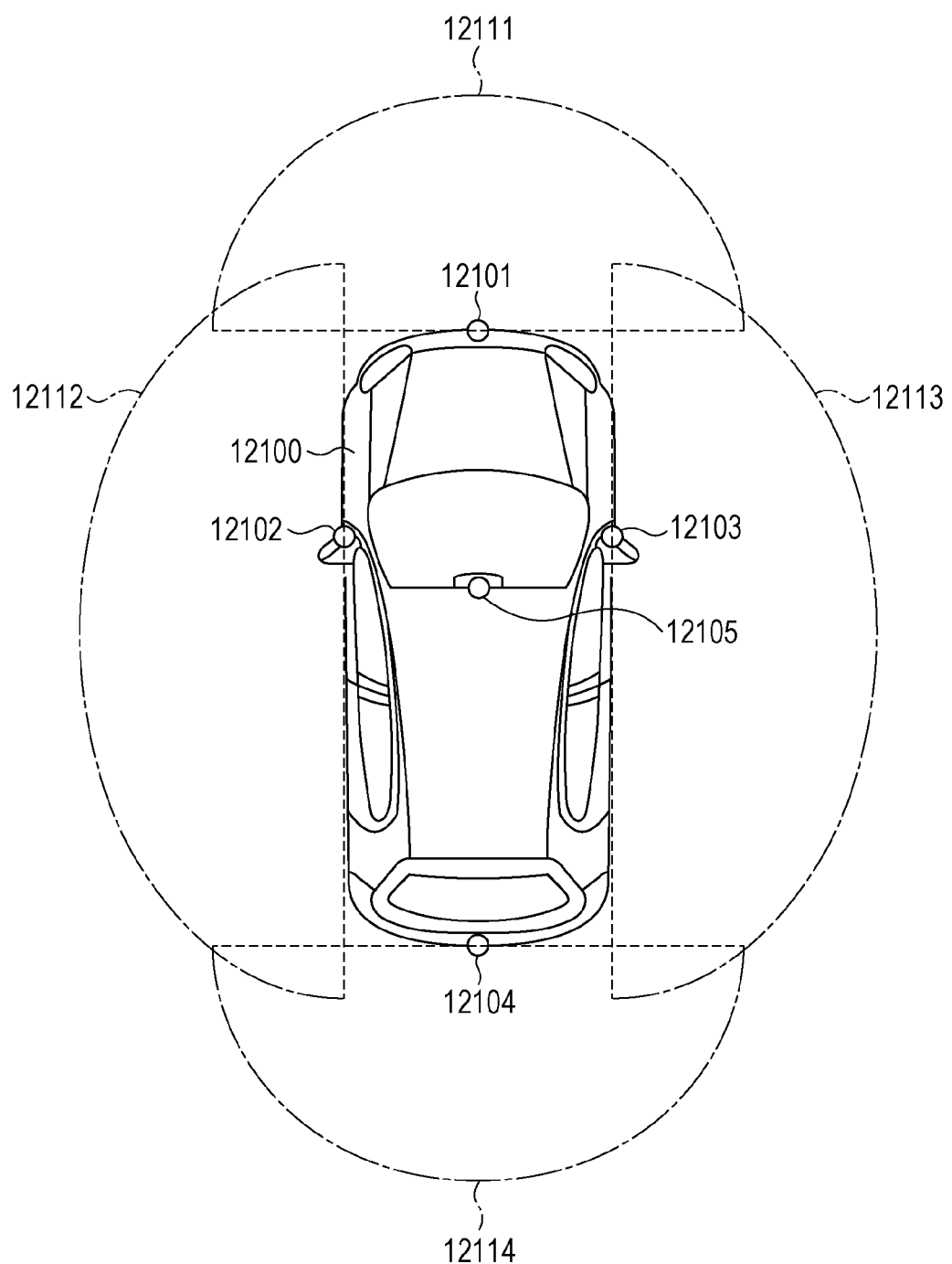
FIG. 14 is an explanatory diagram illustrating an example of an installation position of an imaging section.

FIG. 14 is a diagram illustrating an example of an installation position of the imaging section 12031.

In FIG. 14, imaging sections 12101, 12102, 12103, 12104, 12105 are included as the imaging section 12031.

The imaging sections 12101, 12102, 12103, 12104, 12105 are provided, for example, at positions such as a front nose, a side mirror, a rear bumper, a back door, and an upper portion of a windshield in the interior of a vehicle 12100. The imaging section 12101 provided to the front nose and the imaging section 12105 provided to the upper portion of the windshield within the interior of the vehicle obtain mainly an image of the front of the vehicle 12100. The imaging sections 12102, 12103 provided at the side mirrors obtain mainly images of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 14 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure can be applied has been described above. The technology according to the present disclosure may be applied to the imaging section 12031, for example, out of the configurations described above. Specifically, the transmission circuit 100 in FIG. 1 can be applied to the communication interface of the imaging section 12031. By applying the technology according to the present disclosure to the imaging section 12031, variations in amplitude and common voltage can be adjusted to improve signal quality.

Note that the embodiments described above show examples for embodying the present technology, and the matters in the embodiments and the matters specifying the invention in the claims have corresponding relationships, respectively. Similarly, the matters specifying the invention in the claims and matters with the same names in the embodiments of the present technology have correspondence relationships, respectively. However, the present technology is not limited to the embodiments, and can be embodied by applying various modifications to the embodiments without departing from the gist of the present technology.

Note that effects described in the present specification are merely examples and are not limited, and other effects may be provided.

Note that the present technology may also have the following configuration.

(1) A drive circuit including:
  a driver that outputs a differential signal;
  an amplitude adjuster that generates, from one of a pair of voltages, the other of the pair of voltages, and supplies the other of the pair of voltages to one of a power supply terminal and a ground terminal of the driver; and
  a common voltage adjuster that generates the one of the pair of voltages from an intermediate voltage between the pair of voltages, and supplies the one of the pair of voltages to the other of the power supply terminal and the ground terminal.

(2) The drive circuit according to (1) above, in which the common voltage adjuster includes
  a common-side reference voltage generator that generates a predetermined common-side reference voltage, and
  an operational amplifier that generates the one of the pair of voltages from the common-side reference voltage and the intermediate voltage.

(3) The drive circuit according to (2) above, in which
the common-side reference voltage generator includes a
pair of first resistors connected in series between a
power supply node and a ground node, and
a voltage at a connection node of the pair of first resistors
is supplied as the common-side reference voltage.
(4) The drive circuit according to (2) above, in which
the common-side reference voltage generator includes a
pair of first transistors connected in series between a
power supply node and a ground node, and
a voltage at the connection node of the pair of first
transistors is supplied as the common-side reference
voltage.
(5) The drive circuit according to (2) above, in which
the common-side reference voltage generator includes a
pair of first capacitors connected in series between a
power supply node and a ground node, and
a voltage at a connection node of the pair of first capacitors is supplied as the common-side reference voltage.
(6) The drive circuit according to any one of (1) to (5) above, further including
an intermediate voltage generator that generates the intermediate voltage from the pair of voltages.
(7) The drive circuit according to (6) above, in which
the intermediate voltage generator includes a pair of
second resistors connected in series between the pair of
voltages, and
a voltage at a connection node of the pair of second
resistors is supplied as the intermediate voltage.
(8) The drive circuit according to (6) above, in which
the intermediate voltage generator includes a pair of
second transistors connected in series between the pair
of voltages, and
a voltage at a connection node of the pair of second
transistors is supplied as the intermediate voltage.
(9) The drive circuit according to (6) above, in which
the intermediate voltage generator includes a pair of
second capacitors connected in series between the pair
of voltages, and
a voltage at a connection node of the pair of second
capacitors is supplied as the intermediate voltage.
(10) The drive circuit according to any one of (1) to (9) above, in which the amplitude adjuster includes
an amplitude-side reference voltage generator that generates a predetermined amplitude-side reference voltage, and
a negative feedback circuit that generates the other of the
pair of voltages from the amplitude-side reference
voltage and the one of the pair of voltages.
(11) The drive circuit according to (10) above, in which
the amplitude-side reference voltage generator includes a
current source and a third resistor connected in series
between the one of the pair of voltages and one of a
power supply node and a ground node, and
a voltage at a connection node of the current source and
the third resistor is supplied as the amplitude-side
reference voltage.
(12) The drive circuit according to any one of (1) to (11) above, in which
the amplitude adjuster generates a higher voltage of the
pair of voltages from a lower voltage of the pair of
voltages, and supplies the higher voltage of the pair of
voltages to the power supply terminal, and
the common voltage adjuster generates the lower voltage
of the pair of voltages from the intermediate voltage,
and supplies the lower voltage of the pair of voltages to
the ground terminal.
(13) The drive circuit according to any one of (1) to (11),
in which
the amplitude adjuster generates a lower voltage of the
pair of voltages from a higher voltage of the pair of
voltages, and supplies the lower voltage of the pair of
voltages to the ground terminal, and
the common voltage adjuster generates the higher voltage
of the pair of voltages from the intermediate voltage,
and supplies the higher voltage of the pair of voltages
to the power supply terminal.
(14) The drive circuit according to any one of (1) to (13),
in which
the driver is a source series terminated (SST)-type driver.

REFERENCE SIGNS LIST

100 Transmission circuit
110 Transmission signal generator
200 Drive circuit
210 Amplitude adjuster
211, 222, 241, 242, 261, 262, 281, 282, 291, 292, 411, 422 Resistor
212, 412 Variable resistor
213, 231, 413 Operational amplifier
214, 233, 244, 247, 263, 266, 271, 273, 276, 279, pMOS transistor
215, 232, 245, 246, 264, 265, 272, 274, 277, 280, 293 to 296,
414 nMOS transistor
215 Negative feedback circuit
219 High-voltage-side voltage regulator
220 Amplitude-side reference voltage generator
221, 421 Current source
230 Common voltage adjuster
240 Common-side reference voltage generator
243, 248, 249, 267, 268 Capacitor
250 Output section
260 Intermediate voltage generator
270 Driver
275, 278 Regulator circuit
300 Reception circuit
410 Low-voltage-side voltage regulator
430 Reference voltage generation circuit
12031 Imaging section

The invention claimed is:

1. A drive circuit, comprising:
a driver configured to output a differential signal;
an amplitude adjuster configured to:
generate, from a first voltage of a pair of voltages, a
second voltage of the pair of voltages; and
supply the second voltage of the pair of voltages to a
power supply terminal; and
a common voltage adjuster configured to:
generate the first voltage from an intermediate voltage
between the pair of voltages; and
supply the first voltage to a ground terminal.
2. The drive circuit according to claim 1, wherein the common voltage adjuster includes:
a common-side reference voltage generator configured to
generate a common-side reference voltage, and
an operational amplifier configured to generate the first
voltage based on the common-side reference voltage
and the intermediate voltage.
3. The drive circuit according to claim 2, wherein
the common-side reference voltage generator includes a
pair of resistors connected in series between a power
supply node and a ground node, and a voltage at a connection node of the pair of resistors is the common-side reference voltage.

4. The drive circuit according to claim 2, wherein
the common-side reference voltage generator includes a pair of transistors connected in series between a power supply node and a ground node, and
a voltage at a connection node of the pair of transistors is the common-side reference voltage.

5. The drive circuit according to claim 2, wherein
the common-side reference voltage generator includes a pair of capacitors connected in series between a power supply node and a ground node, and
a voltage at a connection node of the pair of capacitors is the common-side reference voltage.

6. The drive circuit according to claim 1, further comprising an intermediate voltage generator configured to generate the intermediate voltage from the pair of voltages.

7. The drive circuit according to claim 6, wherein
the intermediate voltage generator includes a pair of resistors connected in series between the pair of voltages, and
a voltage at a connection node of the pair of resistors is the intermediate voltage.

8. The drive circuit according to claim 6, wherein
the intermediate voltage generator includes a pair of transistors connected in series between the pair of voltages, and
a voltage at a connection node of the pair of transistors is the intermediate voltage.

9. The drive circuit according to claim 6, wherein
the intermediate voltage generator includes a pair of capacitors connected in series between the pair of voltages, and
a voltage at a connection node of the pair of capacitors is the intermediate voltage.

10. The drive circuit according to claim 1, wherein the amplitude adjuster includes:

an amplitude-side reference voltage generator configured to generate a amplitude-side reference voltage; and
a negative feedback circuit configured to generate the second voltage based on the amplitude-side reference voltage and the first voltage.

11. The drive circuit according to claim 10, wherein
the amplitude-side reference voltage generator includes a current source and a resistor connected in series between the first voltage and one of a power supply node or a ground node, and
a voltage at a connection node of the current source and the resistor is the amplitude-side reference voltage.

12. The drive circuit according to claim 1, wherein the amplitude adjuster is further configured to:
generate a higher voltage of the pair of voltages from a lower voltage of the pair of voltages; and
supply the higher voltage of the pair of voltages to the power supply terminal, and
the common voltage adjuster is further configured to:
generate the lower voltage of the pair of voltages from the intermediate voltage; and
supply the lower voltage of the pair of voltages to the ground terminal.

13. The drive circuit according to claim 1, wherein the amplitude adjuster is further configured to:
generate a lower voltage of the pair of voltages from a higher voltage of the pair of voltages; and
supply the lower voltage of the pair of voltages to the ground terminal, and
the common voltage adjuster is further configured to:
generate the higher voltage of the pair of voltages from the intermediate voltage; and
supply the higher voltage of the pair of voltages to the power supply terminal.

14. The drive circuit according to claim 1, wherein the driver is a source series terminated (SST)-type driver.

* * * * *